United States Patent

Nishijima et al.

(10) Patent No.: US 8,598,914 B2
(45) Date of Patent: Dec. 3, 2013

(54) COMPARATOR CIRCUIT WITH CURRENT MIRROR

(75) Inventors: Kenichi Nishijima, Matsumoto (JP); Kouhei Yamada, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 117 days.

(21) Appl. No.: 13/115,358

(22) Filed: May 25, 2011

(65) Prior Publication Data

US 2011/0298497 A1  Dec. 8, 2011

(30) Foreign Application Priority Data

Jun. 4, 2010  (JP) .................................. 2010-129351

(51) Int. Cl.
*H03K 5/153*  (2006.01)
(52) U.S. Cl.
USPC ............................................. 327/77; 327/89
(58) Field of Classification Search
USPC ...................................................... 327/77, 89
See application file for complete search history.

(56) References Cited

U.S. PATENT DOCUMENTS

| | | | | |
|---|---|---|---|---|
| 6,037,807 A * | 3/2000 | Wu et al. | .......................... | 327/52 |
| 6,348,815 B1 * | 2/2002 | Sim | ................................ | 326/86 |
| 6,429,700 B1 * | 8/2002 | Yang | ............................ | 327/108 |
| 6,750,684 B2 * | 6/2004 | Lim | ................................ | 327/108 |
| 7,642,810 B2 * | 1/2010 | Kang et al. | ....................... | 326/83 |
| 8,054,123 B2 * | 11/2011 | Ha et al. | ......................... | 327/333 |

FOREIGN PATENT DOCUMENTS

| | | |
|---|---|---|
| JP | 62-072019 A | 4/1987 |
| JP | 04-192619 A | 7/1991 |
| JP | 2001-185964 A | 7/2001 |
| JP | 2002-111415 A | 4/2002 |
| JP | 2002-217691 A | 8/2002 |
| JP | 2009-71653 A | 4/2009 |

OTHER PUBLICATIONS

Translation of Office Action issued by Japan Patent Office dated Jul. 16, 2013.

\* cited by examiner

*Primary Examiner* — Kenneth B. Wells
(74) *Attorney, Agent, or Firm* — Rabin & Berdo, P.C.

(57) ABSTRACT

A comparator circuit can achieve a reduction in current consumption with a simple configuration, and can suppress an increase in current consumption accompanying a rise in power source voltage. A current mirror circuit is connected to a power source, and gates of MOSFETs of the circuit are interconnected. An input signal is applied to a gate of an NMOSFET of the circuit. By determining the value of the signal with a constant voltage device, the voltage across a tail resistor is constant, even in the event that the power source voltage and the input signal change.

9 Claims, 9 Drawing Sheets

FIG. 9 RELATED ART ific Field

The present invention relates to a comparator circuit used in a semiconductor integrated circuit.

2. Related Art

There are many cases in which a circuit that detects voltage level is necessary in a semiconductor integrated circuit, and a comparator circuit is used when configuring the voltage detector circuit. Also, in recent years, there has been a strong demand for a reduction in current consumption in circuits, and a further reduction in current consumption is being sought in comparator circuits too.

Figure 8:
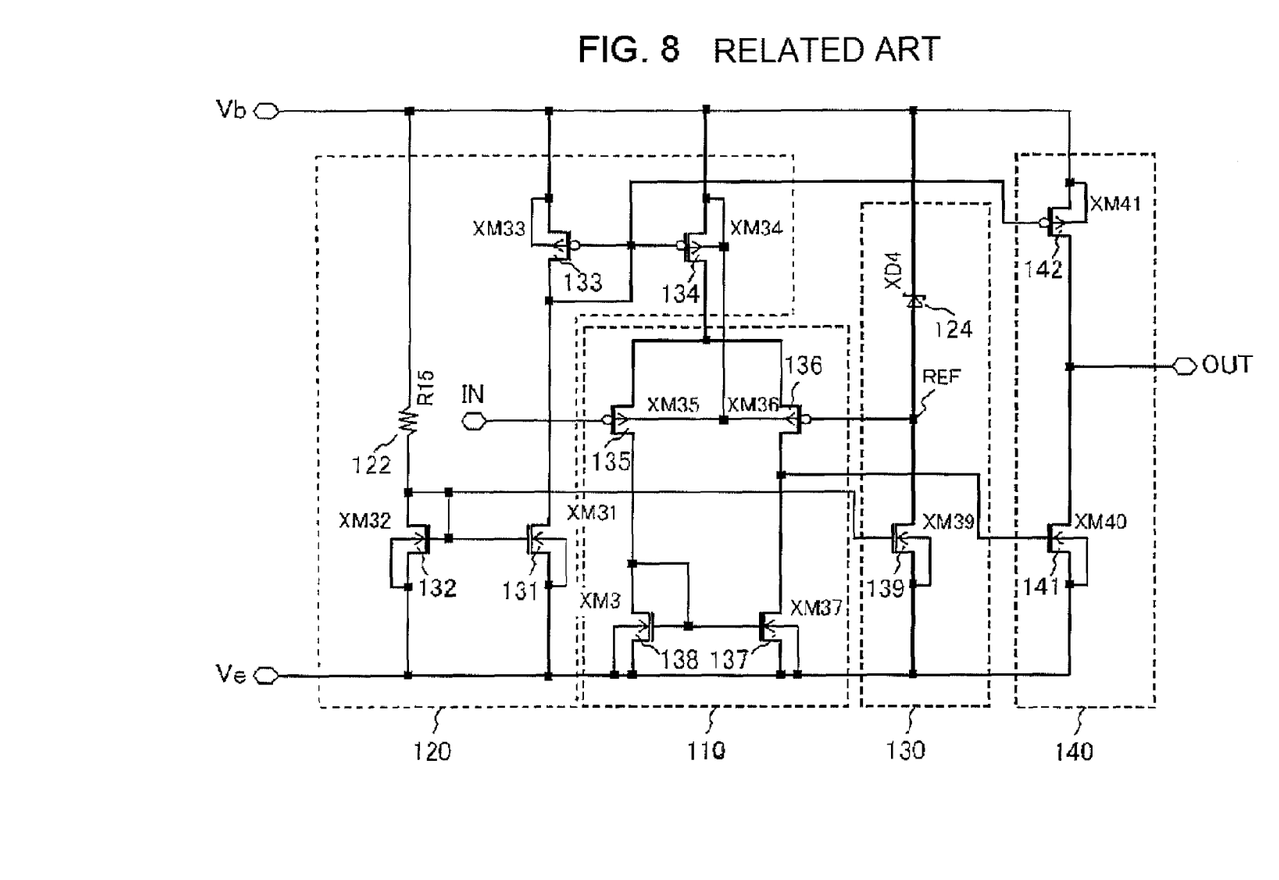
FIG. 8 is a diagram showing a configuration of a heretofore known comparator circuit.

FIG. 8 is a diagram showing a configuration of a heretofore known comparator circuit. Hereafter, a p-channel MOSFET (Metal Oxide Semiconductor Field Effect Transistor) will be abbreviated as PMOSFET, and an n-channel MOSFET as NMOSFET.

In the heretofore known comparator circuit shown in FIG. 8, a PMOSFET 133, a PMOSFET 134, and a PMOSFET 142 form a first current mirror circuit, and an NMOSFET 131, an NMOSFET 132, and an NMOSFET 139 form a second current mirror circuit. A resistor 122, the PMOSFET 133 and PMOSFET 134 of the first current mirror circuit, and the NMOSFET 131 and NMOSFET 132 of the second current mirror circuit form a bias circuit 120 that supplies a bias current to a differential circuit 110 shown hereafter. Also, a PMOSFET 135, a PMOSFET 136, an NMOSFET 137, and an NMOSFET 138 form the differential circuit 110. Herein, the NMOSFET 137 and NMOSFET 138 form a third current mirror circuit. Furthermore, an NMOSFET 141 and a PMOSFET 142 form an output circuit 140. Also, the NMOSFET 139 and a Zener diode 124 form a reference voltage generator circuit 130.

In FIG. 8, the resistor 122, the NMOSFET 131, the NMOSFET 132, and the PMOSFET 133 are used in order to cause a bias current to flow through the PMOSFET 134 of FIG. 8. That is, the current flowing through the drain of the PMOSFET 134 is of the same magnitude as the current flowing through the drain of the PMOSFET 133 forming the first current mirror circuit, and it is the resistor 122, and the NMOSFET 131 and NMOSFET 132 forming the second current mirror circuit, that determine the value of the current flowing through the drain of the PMOSFET 133.

That is, the current flowing through the drain of the NMOSFET 131 forming the second current mirror circuit is of the same magnitude as the current flowing through the drain of the NMOSFET 132, and the value of the current flowing through the drain of the NMOSFET 132 is controlled via the resistor 122. The source of each of the NMOSFET 131 and NMOSFET 132 is connected to a power source terminal Ve (herein, it is taken that the power source terminal Ve is set at a ground GND).

As the drain and gate of the NMOSFET 132 are diode-connected in the example shown, a voltage applied to the resistor 122 is (a power source voltage Vb of a power source Vb—a gate to source voltage Vgs of the NMOSFET 132), and this determines the current flowing through the resistor 122. Then, the current flowing through the resistor 122 determines the bias current flowing to the differential circuit 110 via the first and second current mirrors. With the diode-connected NMOSFET 132, as the square of the gate to source voltage Vgs and the current flowing through the NMOSFET 132 are proportional, the source voltage Vgs does not change greatly even in the event that the current flowing through the NMOSFET 132 changes, meaning that, when the power source voltage Vb changes, most of the amount of change is applied to the resistor 122. Consequently, the configuration is such that the supply of the bias current by the bias circuit 120 is inevitably affected in no small degree by the voltage fluctuation of the power source Vb.

Also, as the second current mirror circuit is configured to include the NMOSFET 139, a drain current proportional to the drain current of the NMOSFET 132 flows through the NMOSFET 139. Also, a voltage applied to a common connection point linking the constant voltage device (the Zener diode 124) forming the reference voltage generator circuit 130 and the drain of the NMOSFET 139 is a voltage wherein a certain voltage (the Zener voltage of the Zener diode 124) is subtracted from the voltage of the power source Vb (hereafter, this will be called a reference voltage (REF)), and this is maintained constant unless there is a fluctuation in the power source voltage Vb.

In FIG. 8, the drain of the PMOSFET 134 is connected to the sources of the PMOSFET 135 and PMOSFET 136 forming a differential pair. The reference voltage REF is input into the gate of the PMOSFET 136, and an input signal Vin used for comparison is input via an input terminal IN into the gate of the PMOSFET 135. Also, the drain of the PMOSFET 135 is connected to the drain and gate of the NMOSFET 138, and also to the gate of the NMOSFET 137, and the drain of the PMOSFET 136 is connected to the drain of the NMOSFET 137. The sources of the NMOSFET 137 and NMOSFET 138 are connected to the power source terminal Ve (the ground GND). Also, the drains of the PMOSFET 136 and NMOSFET 137 are connected to the gate of the NMOSFET 141 forming the output circuit 140, and the drain of the NMOSFET 141 is connected to the drain of the PMOSFET 142. The source of the NMOSFET 141 is connected to the power source terminal Ve (the ground GND). Also, the drain of the NMOSFET 141 and the drain of the PMOSFET 142 are connected to an output terminal OUT.

As heretofore described, the PMOSFET 135, PMOSFET 136, NMOSFET 137, and NMOSFET 138 form the differential circuit 110 and, when the input signal Vin applied to the input terminal IN becomes higher than the reference voltage REF, the impedance of the PMOSFET 136 decreases relatively (e.g. correspondingly). Meanwhile, as the impedance of the PMOSFET 135 increases relatively (e.g., correspondingly), and the current flowing through the PMOSFET 135 decreases, the gate voltage of the NMOSFET 137 decreases, and the impedance of the NMOSFET 137 increases. Owing to the balance between the PMOSFET 136 whose impedance has decreased and the NMOSFET 137 whose impedance has increased, the gate voltage of the NMOSFET 141, which is the potential of the connection point of the NMOSFET 137 and PMOSFET 136, increases, the NMOSFET 141 is turned on, and the voltage of the output terminal OUT is of a low level (L level).

Meanwhile, as the impedance of the PMOSFET 136 increases while the impedance of the PMOSFET 135 decreases when the input signal Vin applied to the input terminal IN becomes lower than the reference voltage REF, the gate voltage of the NMOSFET 137 increases, the impedance of the NMOSFET 137 decreases, the gate voltage of the NMOSFET 141 decreases, the NMOSFET 141 is turned off, and the voltage of the output terminal OUT is of high level (H level).

Figure 5:
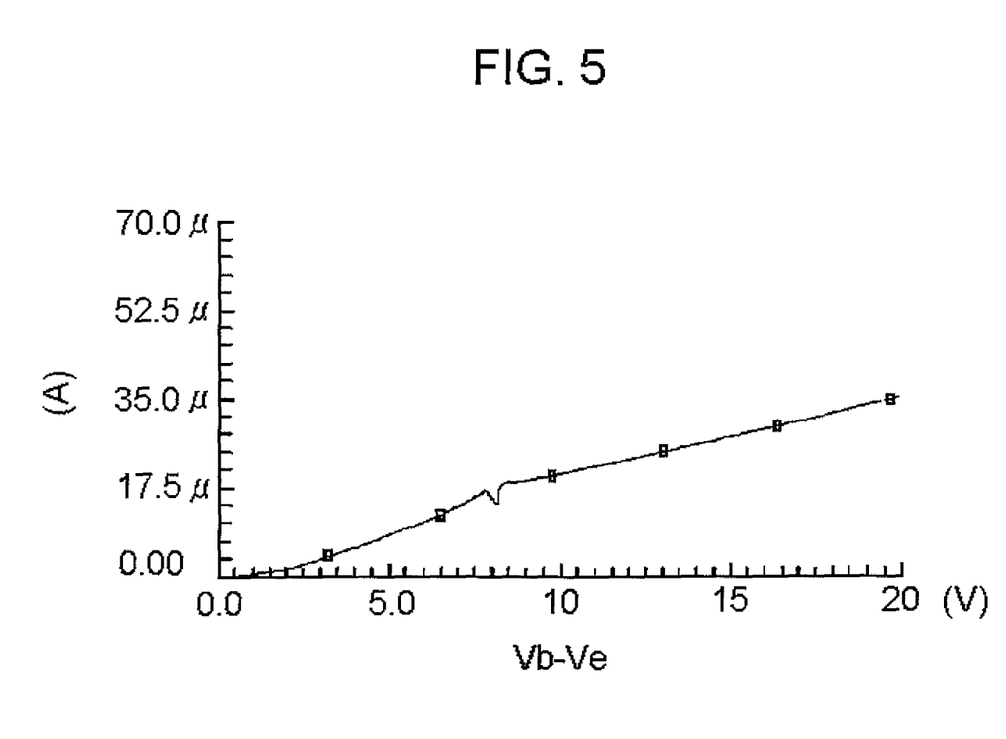
FIG. 5 is a diagram showing a state of the current consumption of the comparator circuit shown in FIG. 4.
Figure 9:
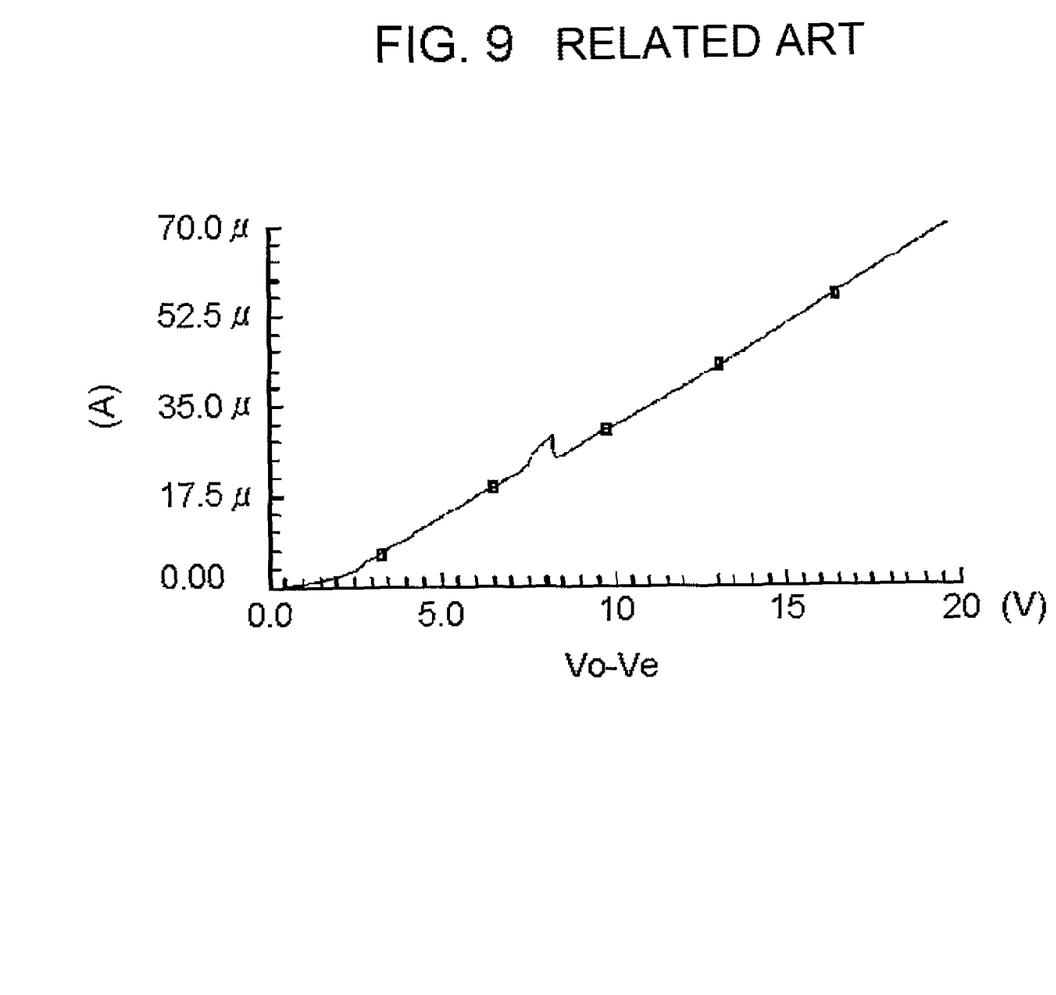
FIG. 9 is a diagram showing a state of the current consumption of the heretofore known comparator circuit shown in FIG. 8.

FIG. 9 is a diagram showing a state of the current consumption of the heretofore known comparator circuit shown in FIG. 8. In FIG. 9, when the power source voltage (the voltage between Vb and Ve) is 15V, the bias current flowing into the differential circuit is 51 μA, and it can be seen that the current consumption is high in comparison with the case of the invention (when the power source voltage (the voltage between Vb and Ve) is 15V, the bias current flowing into the differential circuit is 28 μA, as shown in FIG. 5), to be described hereafter. Herein, the input signal Vin applied to the input terminal IN is obtained from a common connection point linking two resistors (not shown) that connect the power source voltages Vb and Ve in series.

Figure 1:
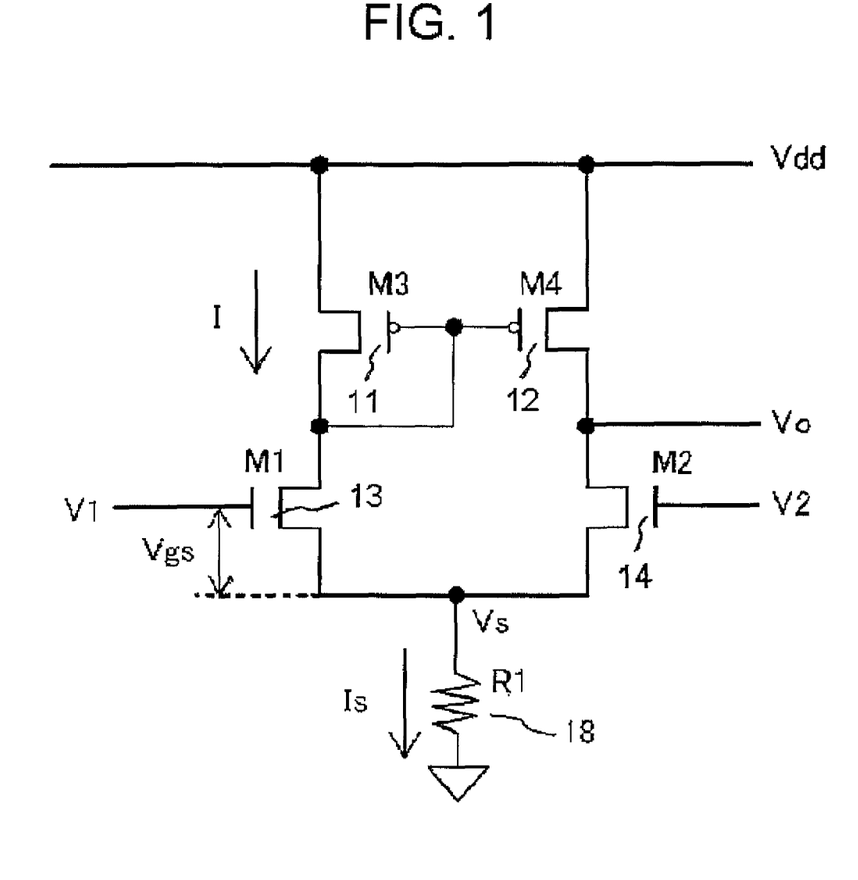
FIG. 1 is a diagram showing a configuration principle of a comparator circuit according to an embodiment of the invention.

In response to this, in order to achieve a balance between a low current consumption and a high-speed response, a comparator circuit shown in FIG. 1 of JP-A-2002-217691 normally reduces the current consumption by suppressing the bias current flowing through a p-channel MOSFET 3, and when it is detected that the values of the two inputs of the comparator circuit are near, the bias current is enhanced by a bias enhancing circuit A, achieving an increase in speed.

As shown by the graph of FIG. 9 showing the state of the current consumption, the heretofore known comparator circuit shown in FIG. 8 is such that, as the bias current (the consumed current) flowing into the differential circuit increases when the input signal Vin increases, it is difficult to say that it is a comparator circuit that enables a realization of reduced current consumption, and there is a demand for the realization of a comparator circuit with which a further reduction in current consumption is possible.

Also, in JP-A-2002-217691, the current consumption at a certain power source voltage is reduced by suppressing the current value of a current source 2 shown in FIG. 1 of JP-A-2002-217691. However, when the power source voltage is increased, it is difficult to suppress a rise in the current consumption. Although a configuration making the current value of the current source 2 shown in FIG. 1 of JP-A-2002-217691 a constant current that does not depend on the power source voltage is not impossible, the current consumption of a circuit for maintaining a constant current increases when increasing the power source voltage, and it is inevitable that the overall configuration is such that the current consumption increases when the power source voltage increases.

Furthermore, compared to the heretofore known comparator circuit, the comparator circuit of JP-A-2002-217691 is of a complex circuit configuration because it includes the bias enhancing circuit, and the like.

SUMMARY OF THE INVENTION

An object of the invention is to provide a comparator circuit that can achieve a reduction in current consumption with a simple configuration, and moreover, can suppress an increase in current consumption accompanying a rise in power source voltage.

A comparator circuit of one aspect of the invention includes first and second MOSFETs whose sources are commonly connected, and to whose gates are supplied first and second input voltages used for comparison, a tail resistor interposed between a common connection point of the sources of the first and second MOSFETs and a first power source, and third and fourth MOSFETs whose sources are connected to a second power source whose voltage differs from that of the first power source, whose gates are connected to the drain of the first MOSFET, and whose drains are connected to the drains of the first and second MOSFETs, wherein a voltage between the voltage of the first power source and the voltage of the second power source, having a predetermined difference from the voltage of the first power source, is input into the gate of the first MOSFET as the first input voltage, and a voltage of a connection point of the drains of the second and fourth MOSFETs is output as a signal showing a result of a comparison between the first and second input voltages.

Also, the comparator circuit according to the aspect of the invention includes a fifth MOSFET whose gate is connected to the gate and drain of the third MOSFET, and a constant voltage device of which one end is connected to the drain of the fifth MOSFET, wherein the source of the fifth MOSFET is connected to the second power source, the other end of the constant voltage device is connected to the first power source, and a common connection point of the drain of the fifth MOSFET and the constant voltage device is connected to the gate of the first MOSFET.

Also, the comparator circuit according to the aspect of the invention is such that, when the first power source is a power source of a voltage higher than that of the second power source, the first and second MOSFETs configuring a differential pair are p-channel MOSFETs.

Also, the comparator circuit according to the aspect of the invention is such that, when the first power source is a power source of a voltage lower than that of the second power source, the first and second MOSFETs forming a differential pair are n-channel MOSFETs.

Also, the comparator circuit according to the aspect of the invention is such that the second input voltage supplied to the gate of the second MOSFET as a subject of comparison is a voltage that increases monotonically with respect to the difference in voltage between the first power source and second power source.

In the comparator circuit, the second input voltage may be taken from a common connection point linking two resistors that connect the first power source and second power source in series.

Also, in the comparator circuit, it is preferable that the constant voltage device is a Zener diode.

According to the comparator circuit of the invention, as the bias current flowing through the differential circuit is determined by the current flowing through the resistor (the tail resistor), the current flowing through the tail resistor is determined by the first input voltage, and the first input voltage is generated based on the voltage of the first power source, it is possible to eliminate the effect on the bias current of a fluctuation in the voltage of the second power source. That is, it is possible to suppress an increase in the bias current caused by a rise in the power source voltage. For this reason, in comparison with JP-A-2002-217691 and the heretofore known comparator circuit shown in FIG. 8, it is possible to realize a further reduction in current consumption.

DETAILED DESCRIPTION OF THE INVENTION

Hereafter, a detailed description will be given of an embodiment of the invention.

Figure 2:
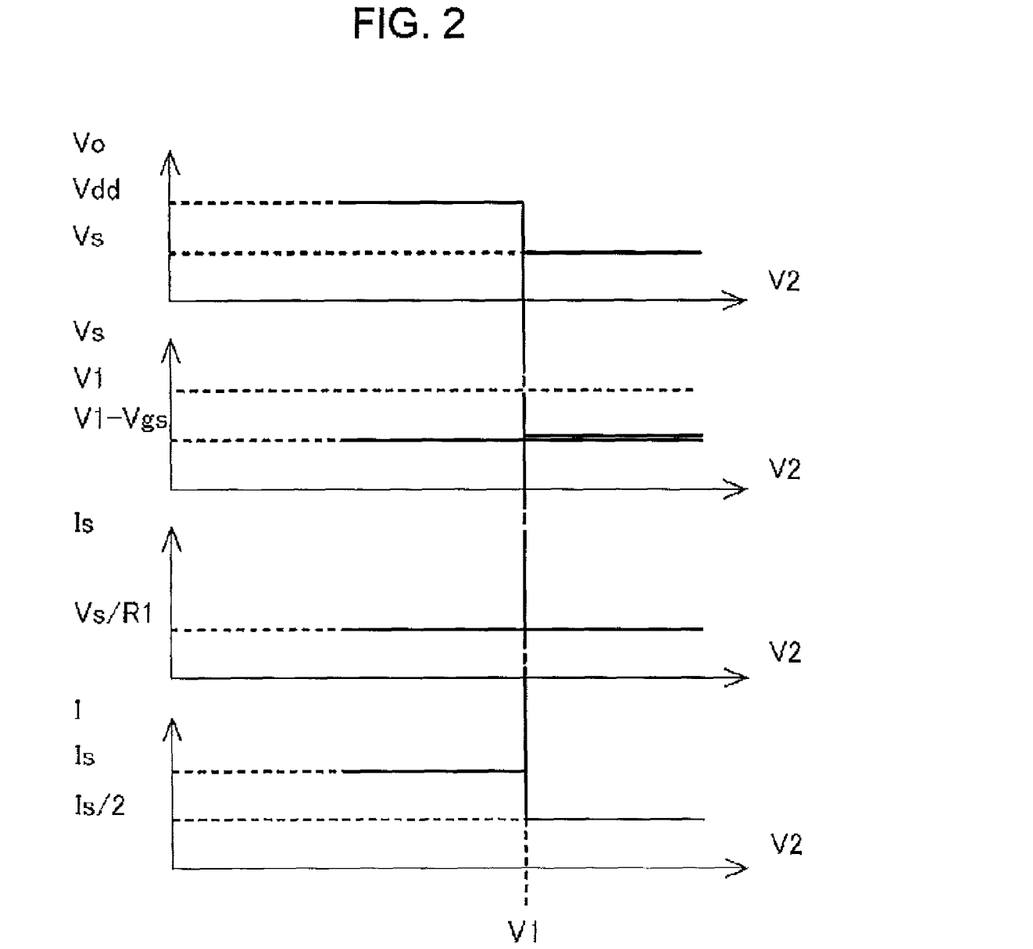
FIG. 2 is a diagram showing a waveform in each portion of the comparator circuit shown in FIG. 1 before and after an inversion action.
Figure 3:
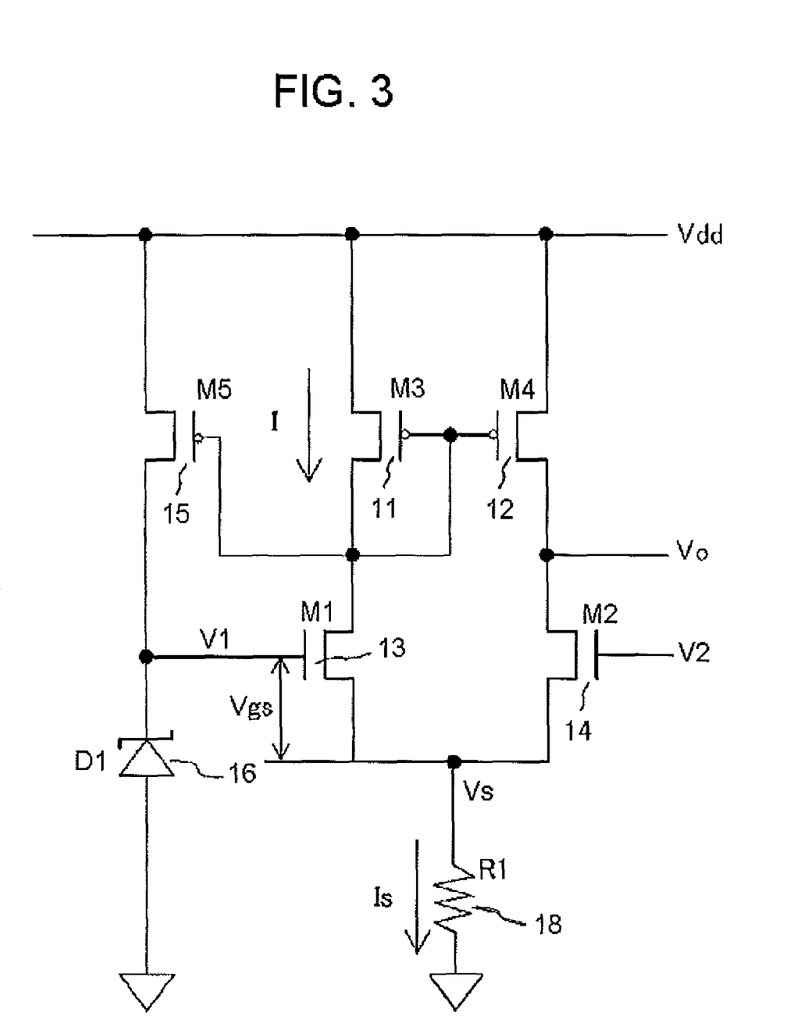
FIG. 3 is a diagram showing a configuration wherein a reference voltage generator circuit is added to the comparator circuit shown in FIG. 1.

FIG. 1 is a diagram showing a configuration principle of a comparator circuit according to an embodiment of the invention. FIG. 2 is a diagram showing a waveform in each portion of the comparator circuit shown in FIG. 1 before and after an inversion action. However, the scales of the vertical axis and horizontal axis in FIG. 2 are made different. FIG. 3 is a diagram showing a configuration wherein a reference voltage generator circuit is added to the comparator circuit shown in FIG. 1. Hereafter, a p-channel MOSFET (Metal Oxide Semiconductor Field Effect Transistor) will be abbreviated as PMOSFET, and an n-channel MOSFET as NMOSFET.

A description will be given of actions of the comparator circuit of the invention, using the configuration principle of the comparator circuit according to the embodiment of the invention shown in FIG. 1. FIG. 1 is for illustrating the configuration principle of the comparator circuit according to the embodiment of the invention, to be described hereafter in FIG. 4, and the circuit configuration is such that a tail resistor (R1) connection position and the application of the PMOSFETs and NMOSFETs in differential pairs are reversed. That is, the invention includes both the type of configuration in FIG. 1 and the type of configuration in FIG. 4.

Figure 4:
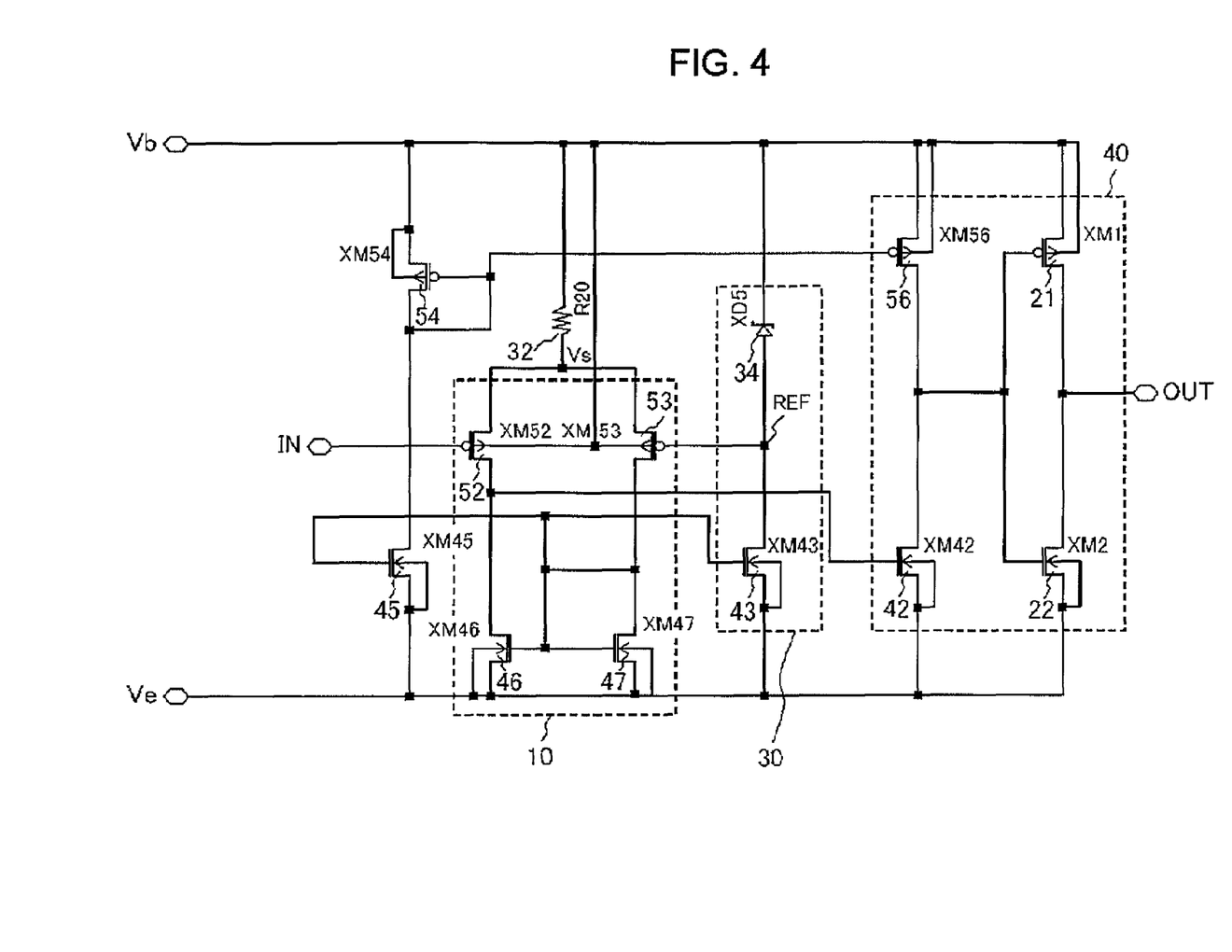
FIG. 4 is a diagram showing a configuration of the comparator circuit according to the embodiment of the invention.

In FIG. 1, the source of each of a PMOSFET 11 and PMOSFET 12 forming a current mirror circuit is connected to a power source Vdd, the gates of the PMOSFET 11 and PMOSFET 12 are connected to each other, and the gate and drain of the PMOSFET 11 are diode-connected. Also, the drain of the PMOSFET 11 is connected to the drain of an NMOSFET 13. A signal V1 referred to here as V1, but substantially a reference voltage, will be described hereafter. In FIG. 4, to be described hereafter, the reference voltage is abbreviated as REF. The signal V1 is applied to the gate of the NMOSFET 13, and the source thereof is connected to one terminal (for the description henceforth, the voltage of this terminal is taken to be Vs) of a tail resistor (in the description henceforth, the resistance value of the resistor 18 is taken to be R1). The other terminal of the tail resistor 18 is connected to an unshown ground GND.

Meanwhile, the drain of the PMOSFET 12 is connected to the drain of an NMOSFET 14. Also, an output signal Vo is derived from a common connection point linking the drains of the PMOSFET 12 and NMOSFET 14. An input signal V2, which is used for comparison, is applied to the gate of the NMOSFET 14, and the source thereof is connected to one terminal of the tail resistor 18. Herein, the source of the NMOSFET 13 and the source of the NMOSFET 14 are commonly connected to one terminal (the voltage of this terminal is Vs, as heretofore described) of the tail resistor 18.

In the circuit shown in FIG. 1, the NMOSFET 13 basically acts as a source follower circuit, and is configured in such a way that the voltage value Vs is determined at a point at which the current flowing through the NMOSFET 13 owing to a gate to source voltage Vgs of the NMOSFET 13 and a Vs/R1 current (this is called a tail current Is) flowing through the tail resistor 18 balance. When the gate to source voltage Vgs of the NMOSFET 13 increases or decreases, the current flowing through the NMOSFET 13 increases or decreases by the square of the amount, meaning that, even in the event that the current flowing to the NMOSFET 14 side increases or decreases, the fluctuation of the voltage value Vs is small. For this reason, taking a threshold value voltage of the NMOSFET 13 to be Vth, the voltage value Vs is (V1−(Vth+α)) (α is a small positive value). This state is shown by the waveform diagram shown second from the top in FIG. 2, wherein a state in which the gate to source voltage Vgs increases or decreases (a state in which the gate to source voltage Vgs increases slightly when the input signal V2 increases, and the current flowing through the NMOSFET 13 decreases by half) is represented by a double line in the example shown.

Also, the NMOSFET 14 in FIG. 1, not acting as a source follower circuit like the NMOSFET 13, acts as a simple switch. The reason that the NMOSFET 14 does not act as a source follower circuit is that the current flowing through the NMOSFET 14 is determined by the PMOSFET 12 of the current mirror circuit, and cannot be controlled by the input signal V2. This point will be further described below.

That is, when supposing that the voltage value Vs is linked to V2, the voltage value Vs decreases in conjunction with V2 when V2<V1, and the current (the tail current Is) flowing through the tail resistor 18 should decrease but, as the gate to source voltage Vgs of the NMOSFET 13 increases when the voltage value Vs decreases, the current flowing from the NMOSFET 13 to the tail resistor 18 increases, and the currents become unbalanced. Also, conversely, the voltage value Vs increases in conjunction with V2 when V2>V1, and the current (the tail current Is) flowing through the tail resistor 18 should increase but, as the gate to source voltage Vgs of the NMOSFET 13 decreases when the voltage value Vs increases, the current flowing through the NMOSFET 13 decreases, or becomes zero, the current also stops flowing to the NMOSFET 12 side owing to the action of the current mirror, the supply destination of the current (the tail current Is) flowing through the tail resistor 18 disappears, and the currents cannot be balanced. Owing to the above, the voltage value Vs is not linked to V2.

In the description thus far, a characteristic of the comparator circuit shown in FIG. 1 is that the voltage value Vs, regardless of (without being linked to) the input signal V2, is determined only by the signal V1 (the signal input into the gate of the NMOSFET 13 connected to the drain of the diode-connected PMOSFET 11, of the PMOSFET 11 and PMOSFET 12 forming the current mirror circuit).

Although it has been heretofore described that the NMOSFET 14 in FIG. 1, not acting as a source follower circuit, acts as a simple switch, in this case, the NMOSFET 14 is turned off when V2<V1, and turned on when V2>V1. However, as the gate to source voltage Vgs of the MOSFET 14 is high when the NMOSFET 14 is turned on, a drain to source voltage Vds of the NMOSFET 14 assumes a small value, becoming Vo≈Vs, in order that the current flowing through the NMOS- FET 14 becomes the current stipulated by the PMOSFET 12 forming the current mirror circuit. This state is shown by the waveform diagram shown in the uppermost portion of FIG. 2. In the case in which the NMOSFET 14 is turned on when V2>V1, a current I flows evenly through the PMOSFET 11 and PMOSFET 12 forming the current mirror circuit, and the value of the current I is Is/2. This state is shown by the waveform diagram shown in the lowermost portion of FIG. 2.

Also, the value of the signal V1 input into the gate of the NMOSFET 13 connected to the drain of the diode-connected PMOSFET 11, of the PMOSFET 11 and PMOSFET 12 forming the current mirror circuit, is determined by a constant voltage device (refer to a Zener diode 16 of FIG. 3, to be described hereafter, and a Zener diode 34 of FIG. 4), because of which the voltage across the tail resistor 18 is a constant voltage determined by the constant voltage device, the voltage across the tail resistor 18 is constant even in the event that the power source voltage and the input signal V2 change, and the current (the tail current Is) flowing through the tail resistor 18 is also constant. A state in which the tail current Is is constant even though the input signal V2 changes is shown by the waveform diagram shown third from the top of FIG. 2.

Although the input signal V2 in the heretofore shown FIGS. 1 and 3 is free, a configuration may also be such that the input signal V2 is taken from a common connection point linking two resistors (not shown) that connect the power source Vdd and the unshown ground GND in series, and applied to the gate of the NMOSFET 14. In this case, the configuration realizes an undervoltage lockout (UVLO) that determines whether or not the power source voltage is equal to or greater than a predetermined voltage and, in the event that it is lower than the predetermined voltage, causes the action of the whole circuit to stop.

As heretofore described, as the bias current flowing through the differential circuit of the comparator circuit of the invention is determined by the current (the tail current Is) flowing through the tail resistor 18, the tail current Is is determined by the signal V1, and the signal V1 is a constant voltage determined by a constant voltage device, it is possible to suppress the effect of the power source voltage on the bias current. Even though the gate to source voltage Vgs of each MOSFET for determining the bias current with the current mirror configuration is constant, the drain to source voltage Vds increases when the power source voltage increases, meaning that it is not possible to completely stop an increase in current consumption.

FIG. 3 is a diagram showing a configuration wherein a reference voltage generator circuit is added to the comparator circuit shown in FIG. 1. That is, the configuration is such that a PMOSFET 15 is further added to the PMOSFET 11 and PMOSFET 12 forming the current mirror circuit of the comparator circuit shown in FIG. 1, forming the same current mirror configuration, the drain of the PMOSFET 15 and the Zener diode 16 are connected in series, and the signal V1 is derived from a common connection point linking the cathode of the Zener diode 16 and the drain of the PMOSFET 15. The configuration is such that a current of the same magnitude as the current flowing through the drain of each of the PMOSFET 11 and PMOSFET 12 forming the current mirror circuit flows through the drain of the PMOSFET 15, and the common connection point is maintained at a constant voltage by the Zener diode 16. Because of this, the signal V1 is determined by the constant voltage device (the Zener diode 16), the voltage across the tail resistor 18 is a constant voltage determined by the constant voltage device, the voltage across the tail resistor 18 is a constant even in the event that the power source voltage changes, and the current (the tail current Is) flowing through the tail resistor 18 is also constant.

FIG. 4 is a diagram showing a configuration of the comparator circuit according to the embodiment of the invention. The comparator circuit according to the embodiment of the invention shown in FIG. 4 shows a more detailed configuration based on the configuration principle of the comparator circuit according to the embodiment of the invention shown in FIG. 1 and, although the circuit configuration is such that the connection position of a tail resistor (R20) and the application of PMOSFETs and NMOSFETs in differential pairs are the reverse of the configuration principle shown in FIG. 1, the principle is the same as that of FIG. 1.

In the circuit shown in FIG. 4, a PMOSFET 52, a PMOSFET 53, an NMOSFET 46, and an NMOSFET 47 configure a differential circuit 10. An NMOSFET 42, a PMOSFET 56, a PMOSFET 21, and an NMOSFET 22 form an output circuit 40. An NMOSFET 43 and the Zener diode 34 form a reference voltage generator circuit 30. The NMOSFET 43, an NMOSFET 45, the NMOSFET 46, and the NMOSFET 47 form a first current mirror circuit. The current flowing through each of the MOSFETs forming the first current mirror is determined by the current flowing through the NMOSFET 47. Also, a PMOSFET 54 and the PMOSFET 56 configure a second current mirror circuit. The current flowing through each of the MOSFETs configuring the second current mirror is determined by the current flowing through the PMOSFET 54.

A tail resistor 32 shown in FIG. 4 is such that one end thereof is connected to a power source voltage Vb, and the other end is commonly connected to the sources of the PMOSFET 52 and PMOSFET 53 forming a differential pair. The gate of the PMOSFET 52 is connected to an input terminal IN, and an input signal Vin is applied to the input terminal IN. Also, the drain of the PMOSFET 52 is connected to the drain of the NMOSFET 46 forming the first current mirror circuit. A common connection point (a point at which the output signal Vo (refer to FIG. 1) of the differential pair is derived) linking the drain of the PMOSFET 52 and the drain of the NMOSFET 46 is connected to the gate of the NMOSFET 42 forming the output circuit 40.

Meanwhile, the gate of the PMOSFET 53 is connected to a common connection point (the voltage of this connection point is called REF) linking the anodes of the NMOSFET 43 and Zener diode 34 forming the reference voltage generator circuit 30. This connection point indicates a reference voltage, and supplies the reference voltage (REF) to the gate of the PMOSFET 53. The drain of the PMOSFET 53, as well as being connected to the drain of the NMOSFET 47 forming the first current mirror circuit, is connected to the gate of the NMOSFET 47 via a diode connection, and furthermore, is connected to the gate of each of the NMOSFET 43, NMOSFET 45, and NMOSFET 46 forming the first current mirror circuit. The source of each of the NMOSFET 43, NMOSFET 45, NMOSFET 46, and NMOSFET 47 forming the first current mirror circuit is connected to a power source terminal Ve (herein, it is taken that the power source terminal Ve is set at the ground GND).

The PMOSFET 53 in FIG. 4 basically acts as a source follower circuit, in the same way as the source follower circuit function performed by the NMOSFET 13 of FIG. 1, and is configured in such a way that the voltage value Vs is determined at a point at which the current flowing through the PMOSFET 53 owing to the gate to source voltage Vgs of the PMOSFET 53 and a (Vb−Vs)/R20 current (the tail current Is) flowing through the tail resistor 32, obtained from the voltage value Vs at a common connection point linking the connection point of the source of each of the PMOSFET 52 and PMOSFET 53 forming the differential pair and one end of the tail resistor 32 (the resistance value is taken to be R20), balance.

Also, the PMOSFET 52 in FIG. 4, not acting as a source follower circuit like the PMOSFET 53, acts as a simple switch, in the same way as the switch function performed by the NMOSFET 14 of FIG. 1. The reason that the PMOSFET 52 does not act as a source follower circuit is that the current flowing through the PMOSFET 52 is determined by the NMOSFET 46 of the first current mirror circuit, and cannot be controlled by the input signal Vin applied to the input terminal IN. As the reason for this is the same as that in the case of FIG. 1, a description thereof will be omitted.

In the description thus far, a characteristic of the comparator circuit shown in FIG. 4 is that the voltage value Vs, regardless of (without being linked to) the input signal Vin, is determined only by the reference voltage (REF) (the voltage input into the gate of the PMOSFET 53 connected to the drain of the diode-connected NMOSFET 47, of the NMOSFET 46 and PMOSFET 47 forming the current mirror circuit).

Also, the value of the reference voltage (REF) input into the gate of the PMOSFET 53 connected to the drain of the diode-connected NMOSFET 47, of the NMOSFET 46 and PMOSFET 47 forming the current mirror circuit, is determined by the constant voltage device (the Zener diode 34) at a value of the power source voltage (Vb—a constant voltage determined by the constant voltage device), because of which the voltage across the tail resistor 32 is a constant voltage determined by the constant voltage device, the voltage across the tail resistor 32 is constant even in the event that the power source voltage and the input signal Vin change, and the current (the tail current Is) flowing through the tail resistor 32 is also constant.

In FIG. 4, as heretofore described, the PMOSFET 52, PMOSFET 53, NMOSFET 46, and NMOSFET 47 form the differential circuit 10 and, when the input signal Vin applied to the input terminal IN becomes higher than the reference voltage REF, the impedance of the PMOSFET 52 increases relatively (e.g., correspondingly). Meanwhile, as the impedance of the PMOSFET 53 decreases relatively (e.g., correspondingly), and the current flowing from the PMOSFET 53 to the NMOSFET 47 increases, the gate voltage of the NMOSFET 46 increases, and the impedance of the NMOSFET 46 decreases. Owing to the balance between the NMOSFET 46 whose impedance has decreased and the PMOSFET 52 whose impedance has increased, the gate voltage of the NMOSFET 42, which is the potential of the connection point of the NMOSFET 46 and PMOSFET 52, decreases, and the impedance of the NMOSFET 42 increases. Also, when the gate voltage of the NMOSFET 46 increases, the gate voltage of the NMOSFET 45 also increases, as a result of which, the impedance of the NMOSFET 45 decreases, and the current flowing increases. Along with this, the impedance of the PMOSFET 54 and PMOSFET 56 forming the second current mirror circuit also decreases, and the current flowing increases. Owing to the balance between the PMOSFET 56 whose impedance has decreased and the NMOSFET 42 whose impedance has increased, the output of an inverter formed by the NMOSFET 42 and PMOSFET 56 is of a high level (H level). This signal is input into an inverter formed of the NMOSFET 22 and PMOSFET 21, and the voltage of an output terminal OUT is of a low level (L level).

Meanwhile, when the input signal Vin applied to the input terminal IN becomes lower than the reference voltage REF, the impedance of the PMOSFET 52 decreases relatively (e.g., correspondingly). Meanwhile, as the impedance of the PMOSFET 53 increases relatively (e.g., correspondingly), the current flowing from the PMOSFET 53 to the NMOSFET 47 decreases, the gate voltage of the NMOSFETs 47 and 46 decreases, and the impedance of the NMOSFET 46 increases. Owing to the balance between the NMOSFET 46 whose impedance has increased and the PMOSFET 52 whose impedance has decreased, the gate voltage of the NMOSFET 42, which is the potential of the connection point of the NMOSFET 46 and PMOSFET 52, increases, and the impedance of the NMOSFET 42 decreases. Also, when the gate voltage of the NMOSFET 46 decreases, the gate voltage of the NMOSFET 45 also decreases, as a result of which, the impedance of the NMOSFET 45 increases, and the current flowing decreases. Along with this, the impedance of the PMOSFET 54 and PMOSFET 56 forming the second current mirror circuit also increases, and the current flowing decreases. Owing to the balance between the PMOSFET 56 whose impedance has increased and the NMOSFET 42 whose impedance has decreased, the output of the inverter formed by the NMOSFET 42 and PMOSFET 56 is of a low level (L level). This signal is input into the inverter formed of the NMOSFET 22 and PMOSFET 21, and the voltage of the output terminal OUT is of a high level (H level).

Also, as the current flowing through the NMOSFET 43 is determined by the current (the tail current Is) flowing through the tail resistor 32, it is also possible to eliminate the effect of the power source voltage on the current consumption in a portion of the circuit in which the reference voltage REF is determined by the constant voltage device (which in FIG. 4 is the Zener diode 34).

Although the input signal Vin in the heretofore described FIG. 4 is free, a configuration may also be such that the input signal Vin is taken from a common connection point linking two resistors (not shown) that connect the power source voltages Vb and Ve in series, and applied to the gate of the NMOSFET 52. In this case, the configuration realizes an undervoltage lockout (UVLO) that determines whether or not the power source voltage is equal to or greater than a predetermined voltage and, in the event that it is lower than the predetermined voltage, causes the action of the whole circuit to stop.

FIG. 5 is a diagram showing a state of the current consumption of the comparator circuit according to the embodiment of the invention shown in FIG. 4. In FIG. 5, when the power source voltage (the voltage between Vb and Ve) is 15V, the bias current flowing into the differential circuit of the comparator circuit is 28 µA, and it can be seen that it is possible to realize a large reduction in current consumption in comparison with the bias current of 51 µA flowing into the differential circuit of a heretofore known comparator circuit shown in FIG. 9. Herein, in the same way as in the case of FIG. 9, the input signal Vin applied to the input terminal IN is obtained from a common connection point linking two resistors (not shown) that connect the power source voltages Vb and Ve in series.

Figure 6:
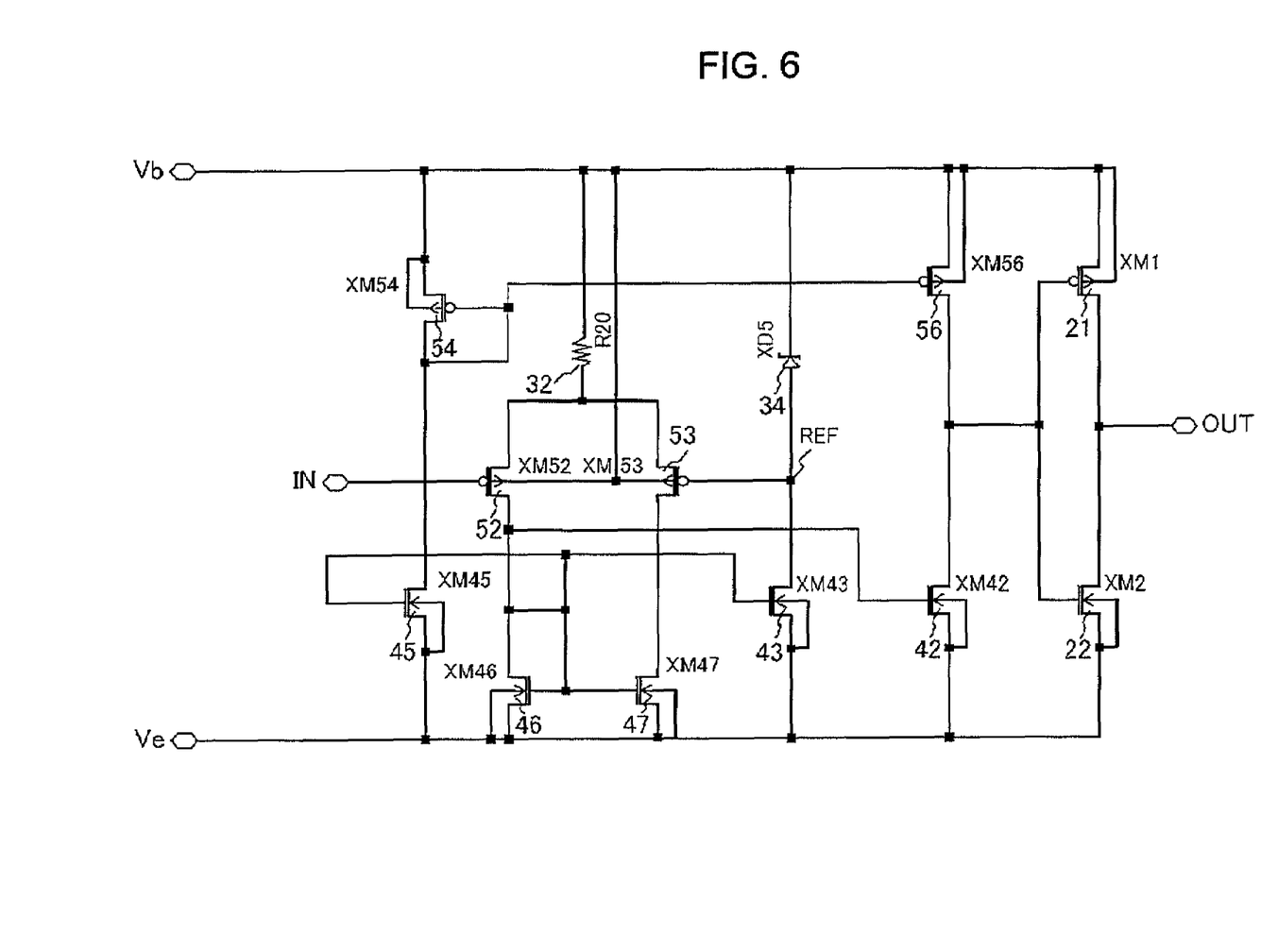
FIG. 6 is a diagram showing a configuration (a comparison example) wherein a diode connection of a current mirror in a differential circuit of the comparator circuit shown in FIG. 4 is reversed.

FIG. 6 is a diagram showing a configuration (a comparison example) wherein the diode connection of the current mirror in the differential circuit of the comparator circuit shown in FIG. 4 is reversed. The comparator circuit (the comparison example) shown in FIG. 6 is such that the diode connection of the NMOSFET 46 and NMOSFET 47 configuring the first current mirror circuit in the differential circuit is the reverse of the diode connection of the NMOSFET 46 and NMOSFET 47 forming the first current mirror circuit in the differential circuit in FIG. 4, while connections and configurations other than this are the same as those shown in FIG. 4.

Although the diode connection in FIG. 6 is the reverse of that in FIG. 4, there is no difference with regard to carrying out actions as a comparator circuit in the same way as FIG. 4. However, as the current flowing through the tail resistor 32 is (Vb−Vin)/R20 when the diode connection of the NMOSFET 46 and NMOSFET 47 forming the first current mirror circuit in the differential circuit is carried out on the input side (the input terminal IN side), as shown in FIG. 6, the current consumption of the comparator circuit is affected by the input signal Vin applied to the input terminal IN, and it is not possible to realize a reduction in current consumption. This is illustrated in FIG. 7, to be described hereafter.

Figure 7:
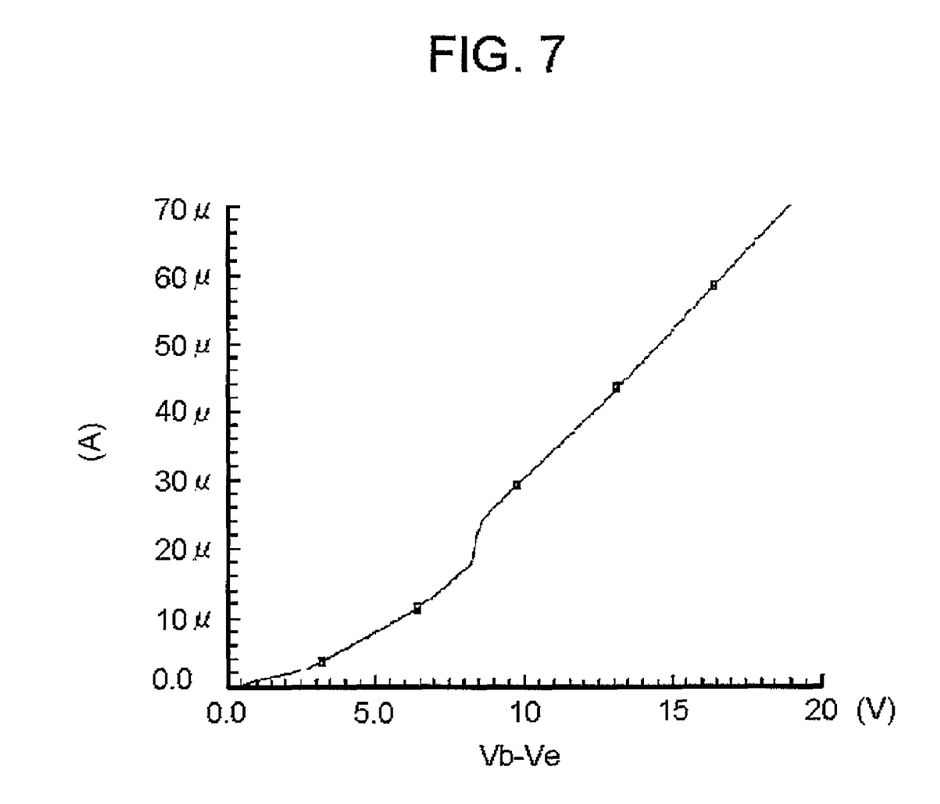
FIG. 7 is a diagram showing a state of the current consumption of the comparator circuit (the comparison example) shown in FIG. 6.

That is, FIG. 7 is a diagram showing a state of the current consumption of the comparator circuit (the comparison example) shown in FIG. 6. Herein too, in the same way as in the cases of FIGS. 5 and 9, the input signal Vin applied to the input terminal IN is obtained from a common connection point linking two resistors (not shown) that connect the power source voltages Vb and Ve in series. Because of this, the current flowing through the tail resistor 32 is (Vb−K·Vb)/R20=(1−k)Vb/R20, which is proportional to the power source voltage Vb (K is a constant wherein 1>K>0). As shown in FIG. 7, when the power source voltage (the voltage between Vb and Ve) is 15V, the bias current flowing into the differential circuit is approximately 50 μA, which is approximately the same as the bias current flowing into the differential circuit of the heretofore known comparator circuit shown in FIG. 9 being 51 μA, and far removed from the bias current flowing into the differential circuit of the comparator circuit of FIG. 4 when the power source voltage (the voltage between Vb and Ve) is 15V being 28 μA, as shown in FIG. 5, and consequently, it can be seen that with the comparator circuit shown in FIG. 6, in the same way as with the heretofore known comparator circuit shown in FIG. 9, it is not possible to realize a reduction in current consumption.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A comparator circuit, comprising:
   first and second MOSFETs whose sources are commonly connected, and to whose gates are supplied first and second input voltages used for comparison;
   a tail resistor interposed between a common connection point of the sources of the first and second MOSFETs and a first power source;
   third and fourth MOSFETs whose sources are connected to a second power source whose voltage differs from that of the first power source, whose gates are connected to the drain of the first MOSFET, and whose drains are connected to the drains of the first and second MOSFETs;
   a fifth MOSFET whose gate is connected to the gate and drain of the third MOSFET; and
   a constant voltage device of which one end is connected to the drain of the fifth MOSFET, wherein
   a voltage between the voltage of the first power source and the voltage of the second power source, having a predetermined difference from the voltage of the first power source, is input into the gate of the first MOSFET as the first input voltage,
   a voltage of a connection point of the drains of the second and fourth MOSFETs is output as a signal showing a result of a comparison between the first and second input voltages, and
   the constant voltage device is a Zener diode.

2. The comparator circuit according to claim 1, wherein
   the source of the fifth MOSFET is connected to the second power source,
   another end of the constant voltage device is connected to the first power source, and
   a common connection point of the drain of the fifth MOSFET and the constant voltage device is connected to the gate of the first MOSFET.

3. The comparator circuit according to claim 1, wherein
   when the first power source is a power source of a voltage higher than that of the second power source, the first and second MOSFETs forming a differential pair are p-channel MOSFETs.

4. The comparator circuit according to claim 1, wherein
   when the first power source is a power source of a voltage lower than that of the second power source, the first and second MOSFETs forming a differential pair are n-channel MOSFETs.

5. A circuit, comprising:
   a first MOSFET and a second MOSFET, a source of the first MOSFET being coupled at a connection point to a source of the second MOSFET;
   a first input voltage coupled to a gate of the first MOSFET, and a second input voltage coupled to a gate of the second MOSFET;
   a resistor coupled between a first power source and the connection point of the source of the first MOSFET and the source of the second MOSFET;
   a third MOSFET and a fourth MOSFET,
      a source of the third MOSFET and a source of the fourth MOSFET being coupled to a second power source,
      a gate of the third MOSFET and a gate of the fourth MOSFET being coupled to a drain of the first MOSFET,
      a drain of the third MOSFET being coupled to a drain of the first MOSFET, and
      a drain of the fourth MOSFET being coupled to a drain of the second MOSFET;
   a fifth MOSFET having a gate coupled to the drain and the gate of the third MOSFET, and a source coupled to the second power source; and
   a constant voltage device having an end coupled to a drain of the fifth MOSFET, and another end coupled to the first power source;
   wherein a voltage at a connection point of the drain of the fourth MOSFET and the drain of the second MOSFET is output as a signal indicating a result of a comparison between the first input voltage and the second input voltage; and
   wherein the constant voltage device includes a Zener diode.

6. The circuit of claim 5, wherein the first input voltage coupled to the gate of the first MOSFET corresponds to a voltage between a voltage of the first power source and a voltage of the second power source.

7. The circuit of claim 5, further comprising a fifth MOSFET having a gate coupled to the drain and the gate of the third MOSFET, and a source coupled to the second power source.

8. The circuit of claim 5, wherein a connection point of the drain of the fifth MOSFET and the end of the constant voltage device is coupled to the gate of the first MOSFET.

9. The circuit of claim 8, wherein the connection point of the drain of the fifth MOSFET and the end of the constant voltage device corresponds to the first input voltage.

* * * * *